(12) United States Patent
Cheng et al.

(10) Patent No.: US 10,902,896 B2
(45) Date of Patent: Jan. 26, 2021

(54) MEMORY CIRCUIT AND METHOD THEREOF

(71) Applicant: Realtek Semiconductor Corporation, Hsinchu (TW)

(72) Inventors: Ching-Sheng Cheng, Hsinchu (TW); Wen-Wei Lin, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/108,326

(22) Filed: Aug. 22, 2018

(65) Prior Publication Data

US 2020/0066316 A1    Feb. 27, 2020

(51) Int. Cl.
| G11C 8/00 | (2006.01) |
| G11C 7/22 | (2006.01) |
| G11C 7/10 | (2006.01) |
| H03L 7/081 | (2006.01) |
| G06F 13/16 | (2006.01) |

(52) U.S. Cl.
CPC .......... *G11C 7/222* (2013.01); *G06F 13/1673* (2013.01); *G11C 7/1057* (2013.01); *G11C 7/1078* (2013.01); *H03L 7/0818* (2013.01)

(58) Field of Classification Search
CPC ..... G11C 7/222; G11C 7/1078; G11C 7/1057; G06F 13/1673; H03L 7/0818
See application file for complete search history.

(56) References Cited

U.S. PATENT DOCUMENTS

| 5,625,584 A | * | 4/1997 | Uchino | ............... G11C 11/5621 365/189.04 |
| 2008/0246446 A1 | * | 10/2008 | Djenguerian | ..... H02M 3/33515 323/234 |
| 2013/0346721 A1 | * | 12/2013 | Giovannini | .......... G11C 29/028 711/167 |
| 2017/0357581 A1 | * | 12/2017 | Yanagidaira | ............ G06F 13/16 |
| 2018/0374804 A1 | * | 12/2018 | Zhang | .................. H05K 1/0219 |

* cited by examiner

*Primary Examiner* — Uyen Smet
(74) *Attorney, Agent, or Firm* — Locke Lord LLP; Tim Tingkang Xia, Esq.

(57) ABSTRACT

The present disclosure is related to a memory circuit. The memory includes a memory controller and a memory interface coupled between the memory controller and a memory device. The memory controller is configured to generate an output signal that is transmitted to the memory device. The memory interface includes a feedback path configured to receive the output signal and generates a feedback signal in response to the output signal and a variable reference voltage. The memory controller further includes a data register so as to sample the feedback signal in response to a clock signal having a phase with an adjustable shift.

14 Claims, 3 Drawing Sheets

MEMORY CIRCUIT AND METHOD THEREOF

BACKGROUND

Technical Field

The present disclosure relates to a memory circuit. More particularly, the present disclosure relates to a memory circuit with a measuring circuit.

Description of Related Art

The memory controller is a digital circuit that manages a flow of data to and from a memory device (e.g., computers main memory). The memory controller can be configured on a separate chip or integrated into another chip, such as being placed on a same die where the memory device is disposed, or as an integral part of a microprocessor. In the latter case, the memory controller is usually referred to as an integrated memory controller (IMC), a memory chip controller (MCC) or a memory controller unit (MCU).

DDR SDRAM (Double data rate synchronous dynamic random-access memory) is one type of memory device. DDR memory controllers are used to drive DDR SDRAM, in which data is transferred on both rising and falling edges of a system's memory clock. DDR memory controllers are significantly more complicated when compared to single data rate controllers, but they allow for two times the data to be transferred without increasing the memory cell's clock rate or bus width. Currently, DDR SDRAM technology is found on high-end video cards and computer memory. However, with the increasing DDR SDRAM clock frequencies and signal edge rate, signal integrity and quality of signal are increasingly important for DDR memory design success.

SUMMARY

An aspect of the present disclosure is to provide a circuit including a memory controller and a memory interface. The memory controller is configured to generate an output signal that is transmitted to a memory device. The memory interface is coupled between the memory controller and the memory device. The memory interface includes a feedback path that is configured to receive the output signal, and to generate a feedback signal in response to the output signal and a variable reference voltage. The memory controller includes a data register, and the data register is configured to sample the feedback signal in response to a clock signal having a phase with an adjustable shift.

Another aspect of the present disclosure is to provide a method. The method includes the steps outlined below. The circuit is controlled to generate a feedback signal in response to a variable reference voltage and an output signal that is transmitted to a memory device. The circuit is controlled to be sample the feedback signal in response to a clock signal having a phase with an adjustable shift by a data register.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present invention. Moreover, the operation of the described structure is not for limiting the order of implementation. Any device with equivalent functions that is produced from a structure formed by a recombination of elements is all covered by the scope of the invention. Drawings are for the purpose of illustration only, and not plotted in accordance with the original size.

As used herein, the terms "first", "second" and the like, etc., are used to describe various elements, components, regions, layers and/or blocks can be understood. However, these elements, components, regions, layers and/or blocks should not be limited by these terms. The terms are used to identify a single element. Therefore, in the following a first element, component, region, layer, and/or blocks may also be termed a second element, component, region, layer, and/or blocks, without departing from the intent of the present invention.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Currently, a data valid width for a memory device can be measured by using the handshake between a memory controller and a memory device, based on a response signal that is transmitted from the memory device to the memory controller. However, to measure the quality of the signal transmission between the memory controller and the memory device, an external oscilloscope has to be used. Accordingly the measurement of the signal transmission between the memory controller and the memory device is too complex and inconvenient.

The present disclosure is related to a memory circuit configured to analyze the signal by using a feedback path, so as to generate an eye diagram, and then to determine the quality of the signal transmission between the memory controller and the memory device. Embodiments of the present disclosure are discussed below.

Figure 1:
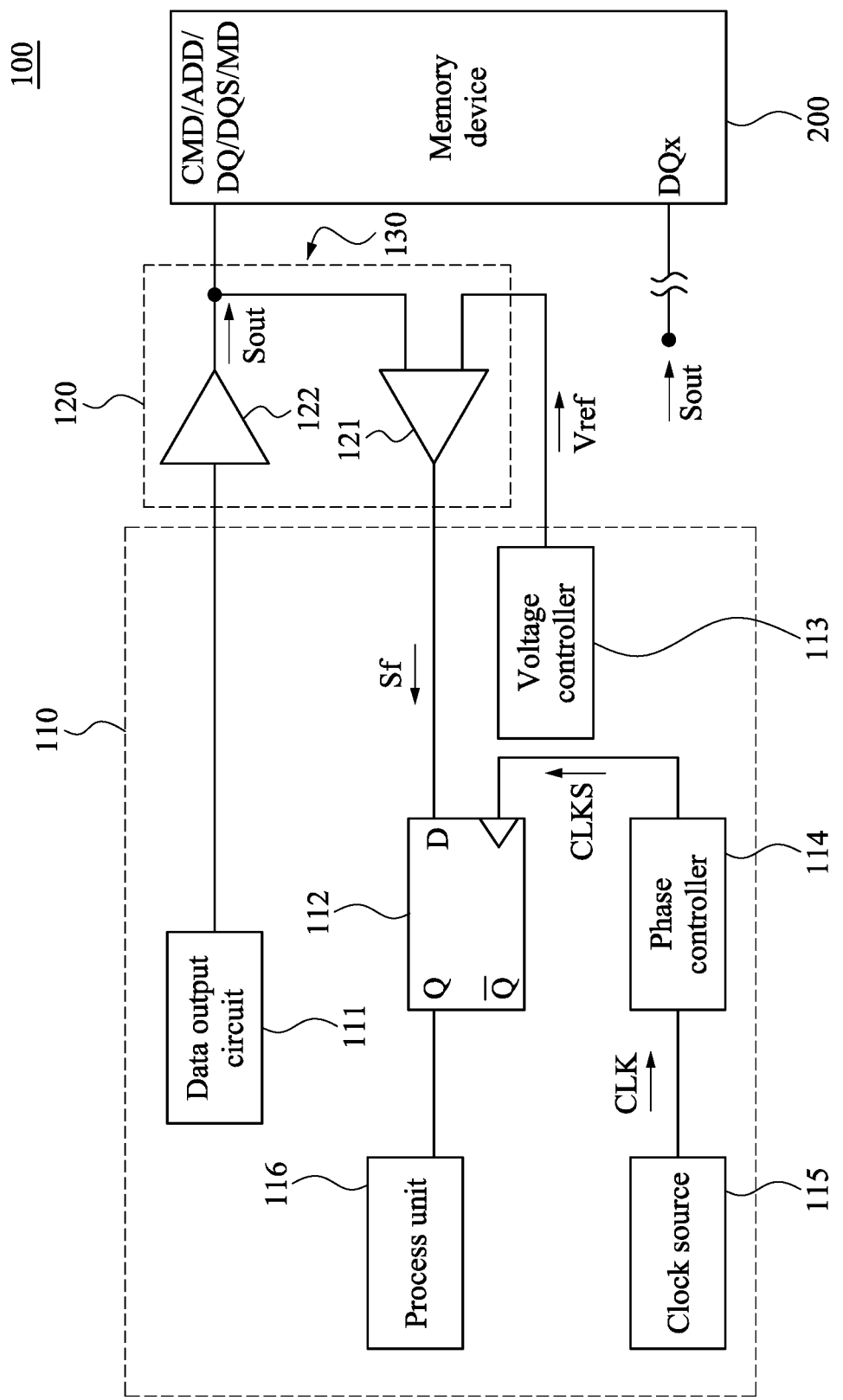
FIG. 1 is a diagram of a circuit in an embodiment of the present disclosure.

FIG. 1 is a diagram of a memory circuit 100 in an embodiment of the present disclosure. As illustratively shown in FIG. 1, the memory circuit 100 includes a memory controller 110 and a memory interface 120. The memory controller 110 can be a DDR controller but the present disclosure is not limited thereto. The memory controller 110 is configured to generate an output signal Sout that is transmitted to a memory device 200 (e.g., DDR SDRAM) via the memory interface 120. The output signal Sout is used to control the memory device to read or write data.

In some embodiments, the memory controller 110 includes a data output circuit 111, and the data output circuit 111 is configured to output the output signal Sout transmitted through the memory interface 120 to the memory device 200. In some embodiments, the output signal Sout is a command signal CMD, an address signal ADD, a data signal DQx, a directory signal MD or other system signal DQ, DQS for the memory device 200 to function. In one embodiment, there are two memory controllers 110 and two memory interface 120, and each memory interface 120 corresponding to each memory controller 110 so as to output signal CMD/ADD and signal DQX, respectively.

The memory interface 120 is coupled between the memory controller 110 and the memory device 200, and includes a feedback path 130 configured to receive the output signal Sout and to generate a feedback signal Sf in response to the output signal Sout and a variable reference voltage Vref. In some embodiments, the memory interface 120 includes a comparator 121, and the comparator 121 is configured to compare the output signal Sout with the variable reference voltage Vref, in order to generate the feedback signal Sf accordingly.

In some embodiments, the memory interface 120 further includes a buffer 122. The input of the buffer 122 is coupled to the data output circuit 111, and the output of the buffer 122 is coupled to the memory device 200 and the feedback path 130. When being enabled, the buffer 122 is configured to buffer the output of the data output circuit 111, in order to output the output signal Sout to the memory device 200.

In some embodiments, the memory interface 120 is made on, or included in, an input/output (I/O) pad. In some other embodiments, the memory interface 120 is made outside the input/output pad.

The memory controller 110 further includes a data register 112, and the data register 112 is configured to sample the feedback signal Sf in response to a clock signal CLKS having a phase with an adjustable shift. In some embodiments, the data register 112 is a D type flip-flop, but the present disclosure is not limited thereto.

By sampling the feedback signal Sf for several times, a sampling result is obtained, and accordingly, the memory controller 110 is able to compare the sampling result with the output signal Sout, thereby calculating the quality of the signal transmission. In some embodiments, the memory controller 110 further includes a process unit 116, and the process unit 116 is coupled to the data register 112, so as to receive and save the sampling results of sampling the feedback signal Sf. In further embodiments, the process unit 116 is configured to generate an eye diagram and calculate the quality of signal transmission. For illustration, the process unit 116 retrieves samples of the feedback signal Sf to obtain a number of sample points, and then compares the feedback signal Sf with the output signal Sout according to those sample points. Based on the comparison result, the process unit 116 is able to confirm whether the output signal Sout is distorted during transmission between the memory controller and the memory device and able to determine the quality of the signal transmission.

In some embodiments, the memory controller 110 further includes a clock source 115 and a phase controller 114. The clock source 115 is configured to generate an original clock signal CLK. The phase controller 114 is configured to receive the original clock signal CLK and apply to the data register 112.

In another embodiment, a clock source 115 and a phase controller 114 can be integrated into a single unit. For example, the memory controller 110 only includes a clock source 115, and the clock source 115 is implemented by a delay chain circuit or a phase-locked loop (PLL) circuit to apply different phases of the clock signal CLKS to the data register 112. In some other embodiments, the clock source 115 is implemented by a delay locked loop (DLL) circuit.

In some embodiments, the memory controller 110 further includes a voltage controller 113, and the voltage controller 113 is configured to generate the variable reference voltage Vref. The voltage controller 113 is able to adjust the amplitude of the reference voltage Vref to set the threshold of feedback signal Sf. In some embodiments, the reference voltage Vref corresponds to a central reference voltage in the memory device 200 and can be adjusted within a predetermined range.

Figure 2:
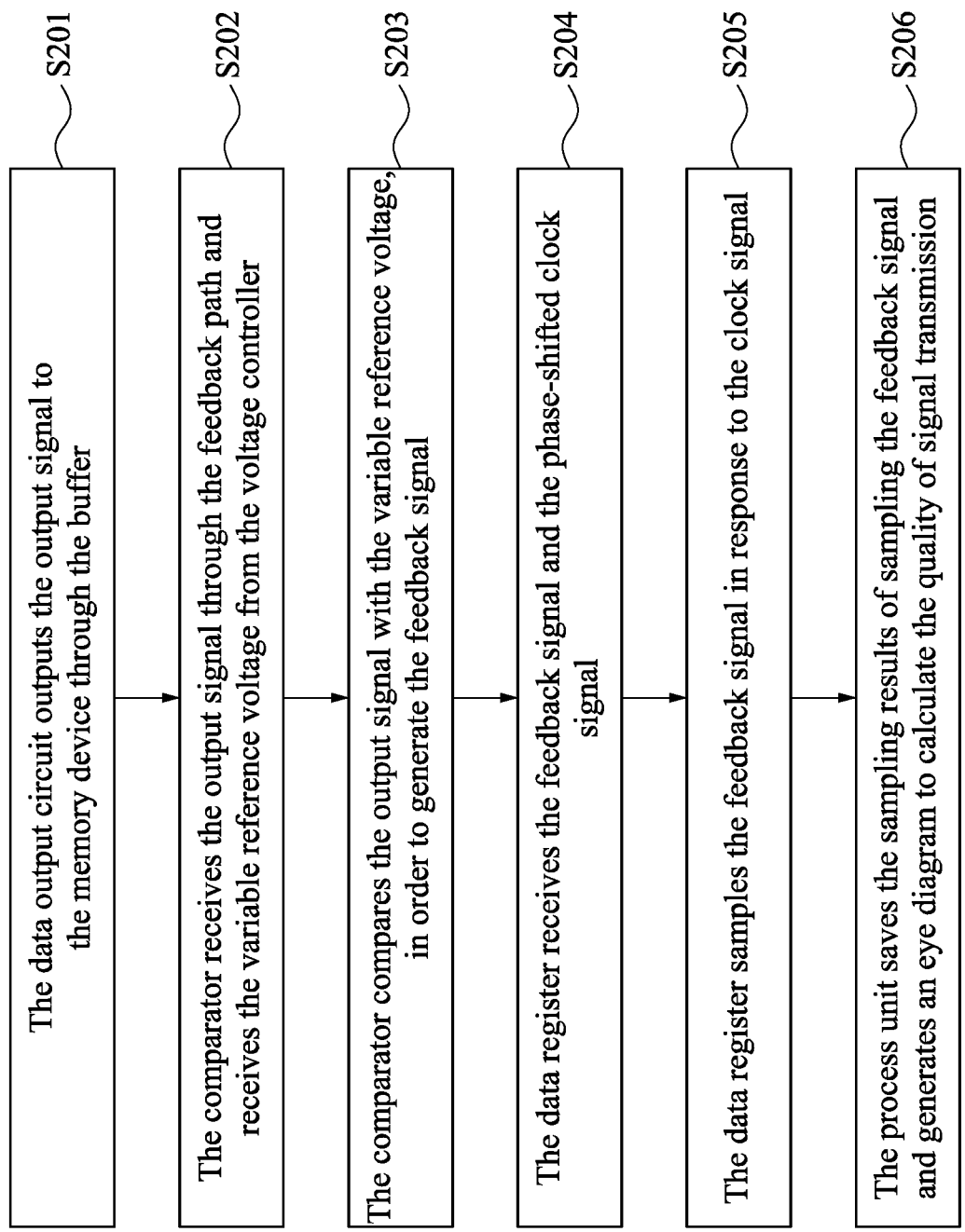
FIG. 2 is a flowchart illustrating a memory circuit measuring method in an embodiment of the present disclosure.

The present disclosure also includes a method which comprises the steps outlined below. FIG. 2 is a flowchart illustrating operations of the memory circuit 100 in FIG. 1, in accordance with some embodiments of the present disclosure. Given for illustrative purposes, the operations in FIG. 2 are discussed below with reference to the memory circuit 100 in FIG. 1, but are not limited thereto. In other words, the operations in FIG. 2 can be applied to any circuit including the memory circuit 100.

In step S201, the data output circuit 111 outputs the output signal Sout to the memory device 200 through the buffer 122. In step S202, one input of the comparator 121 receives the output signal Sout through the feedback path 130, and the other input of the comparator 121 receives the variable reference voltage Vref from the voltage controller 113.

In step S203, the comparator 121 compares the output signal Sout with the variable reference voltage Vref, in order to generate the feedback signal Sf. In this embodiment, for example, if the voltage level of the output signal Sout is higher than the voltage level of the variable reference voltage Vref, the comparator 121 keeps the feedback signal Sf in high logic level. On the other hand, if the voltage level of the output signal Sout is lower than the voltage level of the variable reference voltage Vref, the comparator 121 keeps the feedback signal Sf in low logic level.

In step S204, a data input of the data register 112 receives the feedback signal Sf, and a clock input of the data register 112 receives the phase-shifted clock signal CLKS from the phase controller 114. In this embodiment, the phase controller 114 receives an original clock signal CLK from the clock source 115 and applies different phases of the original clock signal CLK, such that the phase controller 114 outputs the phase-shifted clock signal CLKS to the data register 112.

In step S205, the data register 112 samples the feedback signal Sf in response to the clock signal CLKS. In the sampling process, the phase controller 114 adjusts the phase of the original clock signal CLK sequentially to output the phase-shifted clock signal CLKS and the voltage controller 113 adjusts the amplitude of the reference voltage Vref sequentially, in order to sample the feedback signal Sf, for illustration, for several times.

After the data register 112 samples the feedback signal Sf for several times, In step S206, the process unit 116 saves the sampling results of sampling the feedback signal Sf and generates an eye diagram to calculate or determine the quality of signal transmission. For example, in some embodiments, the process unit 116 is able to compare the sampling result of the feedback signal Sf with the output signal Sout. Then, the process unit 116 calculates the quality of the signal transmission between the memory controller 110 and the memory device 200.

Compared with the related art, in the present disclosure, the quality of the signal transmission is not calculated by using the handshake between a memory controller and a memory device, and thus the process unit 116 does not need to wait for the response signal from the memory device 200. Therefore, it is not only easy to detect the signal transmission, but also can eliminate the external noise which affects the quality of the signal transmission, and more accurately calculate the quality.

With the above features, the memory controller 110 will be able to generate an eye diagram and to calculate the quality of the signal transmission based on the eye diagram. In some embodiments, the process unit 116 generates an eye diagram according to a comparison result between the sampling result of feedback signal Sf and output signal Sout.

Figure 3:
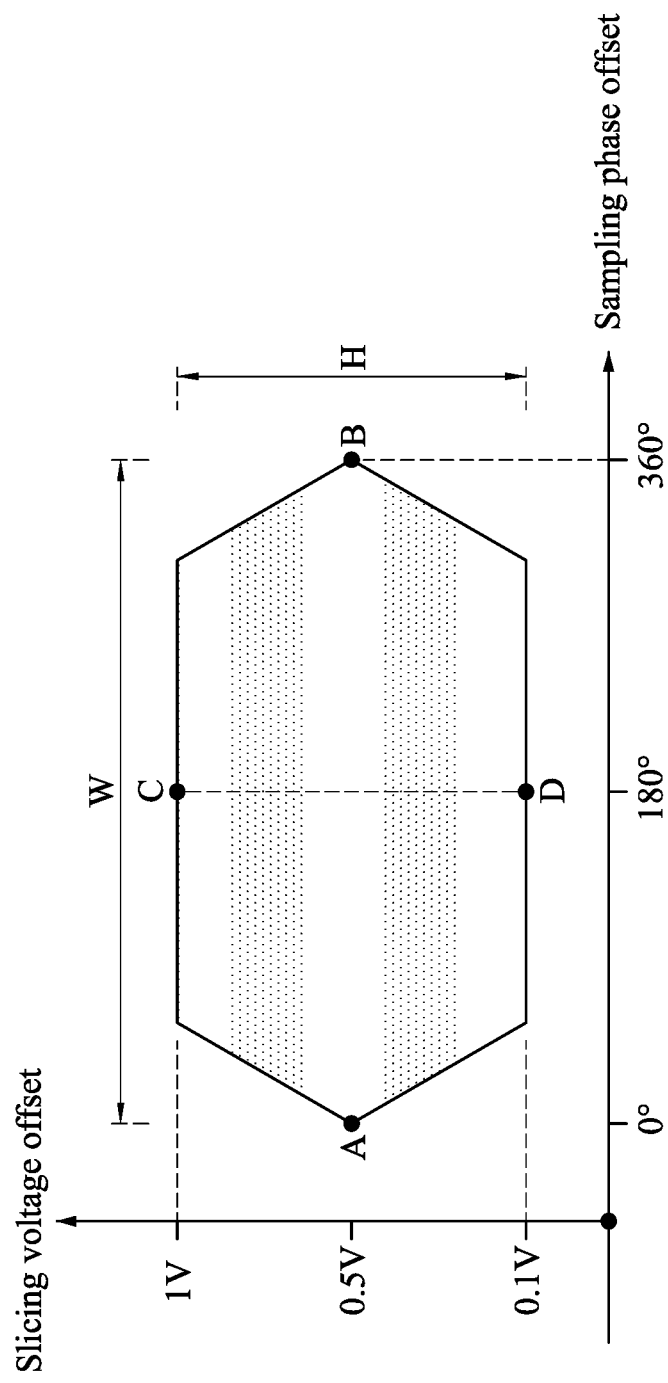
FIG. 3 is a schematic diagram of an eye diagram in an embodiment of the present disclosure.

Refer to FIG. 3, which is a schematic diagram of an eye diagram. Eye diagram is used to calculate the quality of signal transmission. Generally, the bit error rate is related to the coverage area of the boundary of the eye diagram. The larger coverage area of the boundary of the eye diagram indicates the better quality of the signal transmission. As the quality of the signal is enhanced, the bit error rate of the output signal is correspondingly reduced.

For illustration in FIG. 3, the X graduations in the horizontal direction of the eye diagram indicate different sampling phase offset, and the Y graduations in the vertical direction of the eye diagram indicate different slicing voltage offset. The sampling phase offset is determined by phases of the clock signal CLKS, and the slicing voltage offset is determined by the amplitude of the reference voltage Vref. As shown in FIG. 3, the sampling phase offset is in a range of 0°--360°, and the slicing voltage offset is in a range of 0V-1V.

As discussed above, the logic levels of all serial bits are determined according to the relationship between the sampled amplitude of the feedback signal Sf and the slicing voltage offset which is dependent on the reference voltage Vref. If the sampled amplitude of the feedback signal Sf is higher than the slicing voltage offset, this bit is considered to have a high logic level. On the other hand, if the sampled amplitude of the feedback signal Sf is lower than the slicing voltage offset, this bit is considered to have a low logic level.

For illustration in FIG. 3, in the condition A, the sampling phase offset is 0°, and the slicing voltage offset is 0.5V. In the condition B, the sampling phase offset is 360°, and the slicing voltage offset is 0.5V. If the slicing voltage offset is 0.5V and the sampling phase offsets in the range between 0°-360°, the feedback signal Sf can all correspond to the output signal Sout.

In the condition C, the sampling phase offset is 180°, and the slicing voltage offset is 1V. In the condition D, the sampling phase offset is 180°, and the slicing voltage offset is 0.1V. If the sampling phase offsets is 180° and the slicing voltage offsets in the range between 0.1V and 1V, the feedback signal Sf can all corresponds to the output signal Sout.

In some embodiments, the memory controller 110 is able to adjust the phase of the clock signal CLKS by the phase controller 114 so as to estimate an eye width W of the eye diagram. In some embodiments, the memory controller 110 adjusts the phase of the clock signal CLKS so as to estimate a data output to output a buffer output path delay drift. For example, The memory controller 110 may estimate the difference between the original output signal output by the memory controller 110 and the output signal Sout to obtain the buffer output path delay drift through adjusting the phase of the clock signal CLKS. The memory controller 110 can also adjust the amplitude of the variable reference voltage Vref by the voltage controller 113 so as to estimate an eye height H of the eye diagram. After the memory controller 110 adjusts the reference voltage Vref and the clock signal CLKS sequentially, the eye diagram can be arranged. For example, the memory controller changes 0.1V or changes 10 degrees each time when the feedback signal Sf is sampled.

Since the present disclosure samples the feedback signal Sf through the feedback path 130, the memory controller 110 does not need to receive the response from the memory device. Thus, the memory controller 110 is able to complete the calculation more quickly. More importantly, the method of the present disclosure will not be interfered by the noise on the memory device 200 and the method of the present disclosure also can be applied to microcircuits and improve the cost.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A circuit comprising:
   a memory controller configured to generate an output signal that is outputted to a memory device; and
   a memory interface coupled between the memory controller and the memory device, wherein the memory interface is configured to transmit the output signal to the memory device, and the memory interface comprises a feedback path that is configured to receive the output signal, and to generate a feedback signal in response to the output signal and a variable reference voltage;
   wherein the memory controller comprises a data register and a process unit, the data register is configured to sample the feedback signal in response to a clock signal having a phase with an adjustable shift, and the process unit is configured to compare a sampling result of the feedback signal with the output signal.

2. The circuit of claim 1, wherein the feedback path comprises a comparator, and the comparator is configured to compare the output signal with the variable reference voltage to generate the feedback signal.

3. The circuit of claim 1, wherein the memory controller further comprises:
   a voltage controller configured to generate the variable reference voltage.

4. The circuit of claim 1, wherein the memory controller further comprises:
   a clock source configured to generate a phase-shifted clock signal.

5. The circuit of claim 4, wherein the memory controller further comprises:
   a phase controller configured to apply different phases of the clock signal to the data register.

6. The circuit of claim 4, wherein the clock source is implemented by a delay chain circuit or a phase-locked loop (PLL) circuit or a delay locked loop (DLL) circuit.

7. The circuit of claim 1, wherein the memory interface is made on, or included in, an input/output (I/O) pad.

8. The circuit of claim 7, wherein the input/output pad comprises a comparator in the feedback path, and the comparator is configured to compare the output signal with the variable reference voltage to generate the feedback signal.

9. The circuit of claim 1, wherein the data register is a D type flip-flop.

10. A method comprising:
outputting an output signal to a memory device by a memory interface;
generating a feedback signal in response to a variable reference voltage and the output signal that is transmitted to the memory device;
by a data register, sampling the feedback signal in response to a clock signal having a phase with an adjustable shift; and
comparing a sampling result of the feedback signal with the output signal.

11. The method of claim 10, further comprising:
calculating quality of signal transmission between a memory controller and the memory device.

12. The method of claim 11, further comprising:
generating an eye diagram according to a comparison result between the sampling result of the feedback signal and the output signal.

13. The method of claim 12, further comprising:
adjusting an amplitude of the variable reference voltage so as to estimate an eye height of the eye diagram.

14. The method of claim 12, further comprising:
adjusting a phase of the clock signal so as to estimate an eye width of the eye diagram or estimate a data output to output a buffer output path delay drift.

* * * * *